(12) United States Patent
Kim et al.

(10) Patent No.: US 11,417,850 B2
(45) Date of Patent: Aug. 16, 2022

(54) QUANTUM-DOT LIGHT EMITTING DIODE, METHOD OF FABRICATING THE QUANTUM-DOT LIGHT EMITTING DIODE AND QUANTUM-DOT LIGHT EMITTING DISPLAY DEVICE

(71) Applicants: LG DISPLAY CO., LTD., Seoul (KR); Korea Advanced Institute of Science and Technology, Daejeon (KR)

(72) Inventors: Kyu-Nam Kim, Paju-si (KR); Duk-Young Jeon, Paju-si (KR); Hyun-Jin Cho, Paju-si (KR); Sun-Joong Park, Paju-si (KR)

(73) Assignees: LG Display Co., Ltd., Seoul (KR); Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/909,912

(22) Filed: Jun. 23, 2020

(65) Prior Publication Data
US 2020/0403174 A1    Dec. 24, 2020

(30) Foreign Application Priority Data
Jun. 24, 2019    (KR) .................. 10-2019-0074869

(51) Int. Cl.
*H01L 51/50* (2006.01)
*H01L 51/56* (2006.01)
*H01L 51/00* (2006.01)
*H01L 27/32* (2006.01)

(52) U.S. Cl.
CPC ........ *H01L 51/5004* (2013.01); *H01L 51/502* (2013.01); *H01L 51/5056* (2013.01); *H01L 51/5088* (2013.01); *H01L 51/56* (2013.01); *H01L 27/3244* (2013.01); *H01L 51/0039* (2013.01); *H01L 51/0042* (2013.01); *H01L 51/0043* (2013.01); *H01L 51/0059* (2013.01); *H01L 51/0061* (2013.01); *H01L 51/0072* (2013.01); *H01L 2251/552* (2013.01)

(58) Field of Classification Search
CPC .............. H01L 51/5004; H01L 51/502; H01L 51/0039; H01L 51/0042
See application file for complete search history.

(56) References Cited

U.S. PATENT DOCUMENTS

| 2015/0325803 | A1  | 11/2015 | Lee et al.        |
| 2017/0117496 | A1  |  4/2017 | Koh et al.        |
| 2019/0097151 | A1* |  3/2019 | Lee ..... H01L 51/5206 |

FOREIGN PATENT DOCUMENTS

WO    2013154355 A1    10/2013

* cited by examiner

*Primary Examiner* — Anthony Ho
(74) *Attorney, Agent, or Firm* — Morgan, Lewis & Bockius LLP

(57) ABSTRACT

The present disclosure provides a quantum dot (QD) light emitting diode including: a first electrode; a second electrode facing the first electrode; a QD emitting material layer positioned between the first electrode and the second electrode and including a QD and an organic material; a hole auxiliary layer positioned between the first electrode and the QD emitting material layer; and an electron auxiliary layer positioned between the QD emitting material layer and the second electrode, wherein the organic material has a highest occupied molecular orbital (HOMO) level higher than a material of the hole auxiliary layer.

14 Claims, 7 Drawing Sheets

QUANTUM-DOT LIGHT EMITTING DIODE, METHOD OF FABRICATING THE QUANTUM-DOT LIGHT EMITTING DIODE AND QUANTUM-DOT LIGHT EMITTING DISPLAY DEVICE

CROSS-REFERENCE TO RELATED APPLICATIONS

This application claims priority to and the benefit of Republic of Korea Patent Application No. 10-2019-0074869 filed in the Republic of Korea on Jun. 24, 2019, which is hereby incorporated by reference.

BACKGROUND

Field of the Disclosure

The present disclosure relates to a quantum-dot (QD) light emitting diode, and more particularly, to a QD light emitting diode and a QD light emitting display device having improved charge balance and a method of fabricating the QD light emitting diode.

Description of the Related Art

Recently, as society has entered in earnest upon an information age, a field of display devices that represent all sorts of electrical signals as visual images has been developed rapidly. For example, a flat panel display device, such as a liquid crystal display (LCD) device, a plasma display panel (PDP) device, a field emission display (FED) device, and an organic light emitting diode (OLED) device, has been introduced.

On the other hand, use of quantum dots (QD) to display devices has been researched or studied.

In the QD, an electron in unstable state transitions from a conduction band to a valence band such that light is emitted. Since the QD has a high extinction coefficient and excellent quantum yield, strong fluorescent light is emitted from the QD. In addition, since the wavelength of the light from the QD is controlled by a size of the QD, entire visible light can be emitted by controlling the size of the QD.

The QD light emitting diode using the QD includes an anode, a cathode facing the anode and a QD emitting layer. The QD emitting layer is disposed between the anode and the cathode and includes the QD. When the hole and the electron are respectively injected from the anode and the cathode into the QD emitting layer, the light is emitted from the QD emitting layer.

However, in the related art QD light emitting diode, a desired emitting efficiency is not provided, and there is a limitation in the emitting efficiency.

SUMMARY

Accordingly, the present disclosure is directed to a QD light emitting diode, a QD light emitting display device and a method of fabricating the QD light emitting diode that substantially obviate one or more of the problems due to limitations and disadvantages of the related art, and have other advantages.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

To achieve these and other advantages in accordance with the purpose of the embodiments of the present disclosure, as described herein, a quantum dot (QD) light emitting diode comprises: a first electrode; a second electrode facing the first electrode; a QD emitting material layer positioned between the first electrode and the second electrode and including a QD and an organic material; a hole auxiliary layer positioned between the first electrode and the QD emitting material layer; and an electron auxiliary layer positioned between the QD emitting material layer and the second electrode, wherein the organic material has a highest occupied molecular orbital (HOMO) level higher than a material of the hole auxiliary layer.

In another aspect, a QD light emitting display device comprises: a substrate; a QD light emitting diode positioned on or over the substrate, the QD light emitting diode including: a first electrode; a second electrode facing the first electrode; a QD emitting material layer positioned between the first electrode and the second electrode and including a QD and an organic material; a hole auxiliary layer positioned between the first electrode and the QD emitting material layer; and an electron auxiliary layer positioned between the QD emitting material layer and the second electrode; and a thin film transistor positioned between the substrate and the QD light emitting diode and connected to the QD light emitting diode, wherein the organic material has a HOMO level higher than a material of the hole auxiliary layer.

In another aspect, a method of fabricating a QD light emitting diode comprises: forming a first electrode; forming a hole auxiliary layer of a hole auxiliary material on the first electrode; forming a QD emitting material layer on the hole auxiliary layer by coating an emitting material solution, wherein the emitting material solution includes a QD, an organic material and a solvent; forming an electron auxiliary layer on the QD emitting material layer; and forming a second electrode on the electron auxiliary layer, wherein the organic material has a HOMO level higher than the hole auxiliary material.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain principles of the disclosure.

DETAILED DESCRIPTION

Reference will now be made in detail to aspects of the disclosure, examples of which are illustrated in the accompanying drawings.

Figure 1:
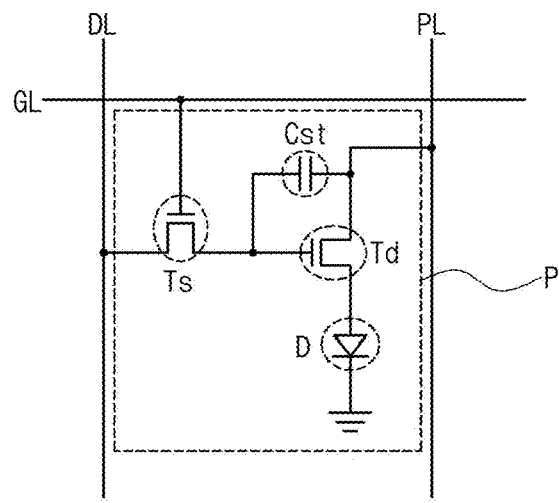
FIG. 1 is a schematic circuit diagram of a QD light emitting display device according to the present disclosure.

FIG. 1 is a schematic circuit diagram of a QD light emitting display device according to the present disclosure.

As shown in FIG. 1, in a QD light emitting display device, a gate line GL, a data line DL and a power line PL are formed, and a pixel region P is defined by the gate and data lines GL and DL. In the pixel region P, a switching thin film transistor (TFT) Ts, a driving TFT Td, a storage capacitor Cst and a QD light emitting diode D are formed.

The switching TFT Ts is connected to the gate line GL and the data line DL, and the driving TFT Td and the storage capacitor Cst are connected to the switching TFT Ts and the power line PL. The QD light emitting diode D is connected to the driving TFT Td.

In the QD display device, when the switching TFT Ts is turned on by a gate signal applied through the gate line GL, a data signal from the data line DL is applied to a gate electrode of the driving TFT Td and an electrode of the storage capacitor Cst through the switching TFT Ts.

When the driving TFT Td is turned on by the data signal, an electric current is supplied to the QD light emitting diode D from the power line PL through the driving TFT Td. As a result, the QD light emitting diode D emits light. The storage capacitor Cst serves to maintain the voltage of the gate electrode of the driving TFT Td for one frame.

Accordingly, the QD light emitting display device displays images.

Figure 2:
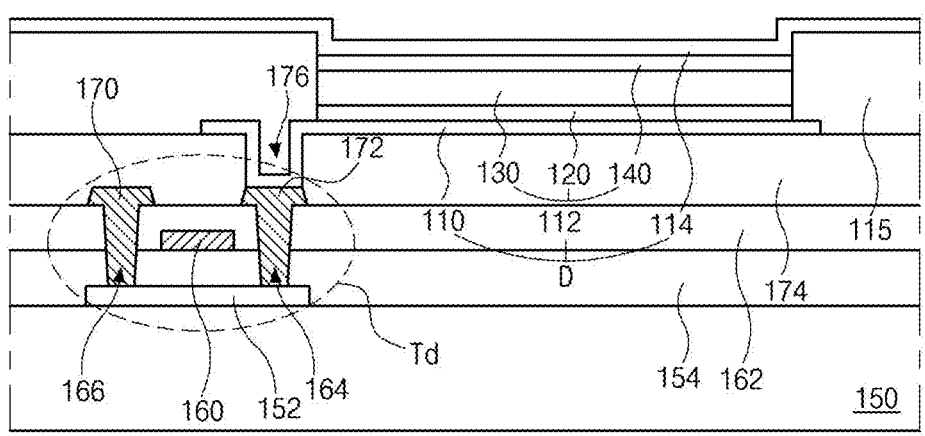
FIG. 2 is a schematic cross-sectional view of a QD light emitting display device of the present disclosure.

FIG. 2 is a schematic cross-sectional view of a QD light emitting display device of the present disclosure.

As shown in FIG. 2, the QD light emitting display device 100 includes a substrate 150, the TFT Td on the substrate 150 and the QD light emitting diode D over the substrate 150 and connected to the TFT Td.

The substrate 150 may be a glass substrate or a flexible substrate of polyimide. The substrate 150 may have a flexible property.

Although not shown, a buffer layer of an inorganic material, e.g., silicon oxide or silicon nitride, may be formed on the substrate 150.

The TFT Td is connected to the switching TFT Ts (of FIG. 1) and includes a semiconductor layer 152, a gate electrode 160, a source electrode 170 and a drain electrode 172.

The semiconductor layer 152 is formed on the substrate 150. The semiconductor layer 152 may be formed of an oxide semiconductor material or a poly-silicon.

When the semiconductor layer 152 includes the oxide semiconductor material, a light-shielding pattern (not shown) may be formed under the semiconductor layer 152. The light to the semiconductor layer 152 is shielded or blocked by the light-shielding pattern such that thermal degradation of the semiconductor layer 152 can be prevented. On the other hand, when the semiconductor layer 152 includes polycrystalline silicon, impurities may be doped into both sides of the semiconductor layer 152.

A gate insulating layer 154 is formed on the semiconductor layer 152. The gate insulating layer 154 may be formed of an inorganic insulating material such as silicon oxide or silicon nitride.

A gate electrode 160, which is formed of a conductive material, e.g., metal, is formed on the gate insulating layer 154 to correspond to a center of the semiconductor layer 152. The gate electrode 160 is connected to the switching TFT.

The gate insulating layer 154 is formed on the entire surface of the substrate 150. Alternatively, the gate insulating layer 154 may be patterned to have the same shape as the gate electrode 160.

An interlayer insulating layer 162, which is formed of an insulating material, is formed on an entire surface of the substrate 150 including the gate electrode 160. The interlayer insulating layer 162 may be formed of an inorganic insulating material, e.g., silicon oxide or silicon nitride, or an organic insulating material, e.g., benzocyclobutene or photo-acryl.

The interlayer insulating layer 162 includes first and second contact holes 166 and 164 exposing both sides of the semiconductor layer 152. The first and second contact holes 166 and 164 are positioned at both sides of the gate electrode 160 to be spaced apart from the gate electrode 160.

The first and second contact holes 166 and 164 extend into the gate insulating layer 154. Alternatively, when the gate insulating layer 154 is patterned to have the same shape as the gate electrode 160, there may be no first and second contact holes 166 and 164 in the gate insulating layer 154.

A source electrode 170 and a drain electrode 172, which are formed of a conductive material, e.g., metal, are formed on the interlayer insulating layer 162. The source electrode 170 and the drain electrode 172 are spaced apart from each other with respect to the gate electrode 160 and respectively contact both sides of the semiconductor layer 152 through the first and second contact holes 166 and 164. The source electrode 170 is connected to the power line PL (of FIG. 1).

The TFT Td including the semiconductor layer 152, the gate electrode 160, the source electrode 170 and the drain electrode 172 serves as a driving element.

The gate electrode 160, the source electrode 170 and the drain electrode 172 are positioned over the semiconductor layer 152. Namely, the TFT Td has a coplanar structure.

Alternatively, in the TFT Td, the gate electrode may be positioned under the semiconductor layer, and the source and drain electrodes may be positioned over the semiconductor layer such that the TFT Td may have an inverted staggered structure. In this instance, the semiconductor layer may include amorphous silicon.

On the other hand, the switching TFT Ts (of FIG. 1) may have substantially same structure as the TFT Td.

A passivation layer 174, which includes a drain contact hole 176 exposing the drain electrode 172 of the TFT Td, is formed to cover the TFT Td.

A first electrode 110, which is connected to the drain electrode 172 of the TFT Td through the drain contact hole 176, is separately formed on the passivation layer 174 in each pixel region. The first electrode 110 may be an anode and may be formed of a conductive material having a relatively high work function. For example, the first electrode 110 may be formed of a transparent conductive material such as indium-tin-oxide (ITO) or indium-zinc-oxide (IZO).

When the QD display device 100 of the present disclosure is a top-emission type, a reflection electrode or a reflection layer may be formed under the first electrode 110. For example, the reflection electrode or the reflection layer may be formed of aluminum-palladium-copper (APC) alloy.

A bank layer 115, which covers edges of the first electrode 110, is formed on the passivation layer 174. The bank 115 exposes a center of the first electrode 110 in the pixel region.

An emitting layer 112 is formed on the first electrode 110. The emitting layer 112 includes a QD emitting material layer (QD EML) 130, a hole auxiliary layer 120 under the QD EML 130 and an electron auxiliary layer 140 over the QD EML 130.

A second electrode 114 is formed over the substrate 150 including the emitting layer 112. The second electrode 114 is positioned at an entire surface of the display area. The second electrode 114 may be a cathode and may be formed of a conductive material having a relatively low work function. For example, the second electrode 114 may be formed of aluminum (Al), magnesium (Mg) or Al—Mg alloy.

The hole auxiliary layer 120 is positioned between the first electrode 110 and the QD EML 130, and the electron auxiliary layer 140 is positioned between the QD EML 130 and the second electrode 114.

The first electrode 110, the emitting layer 112 and the second electrode 114 constitute the QD light emitting diode D.

Although not shown, an encapsulation film for preventing moisture and/or oxygen penetration may be formed on or over the QD light emitting diode D. For example, the encapsulation film may include at least one inorganic layer and at least one organic layer, and at least one inorganic layer and at least one organic layer may be alternately stacked.

A display device including the QD light emitting diode is explained. Alternatively, the QD light emitting diode may be included in an optoelectric device such as a solar cell.

Figure 3:
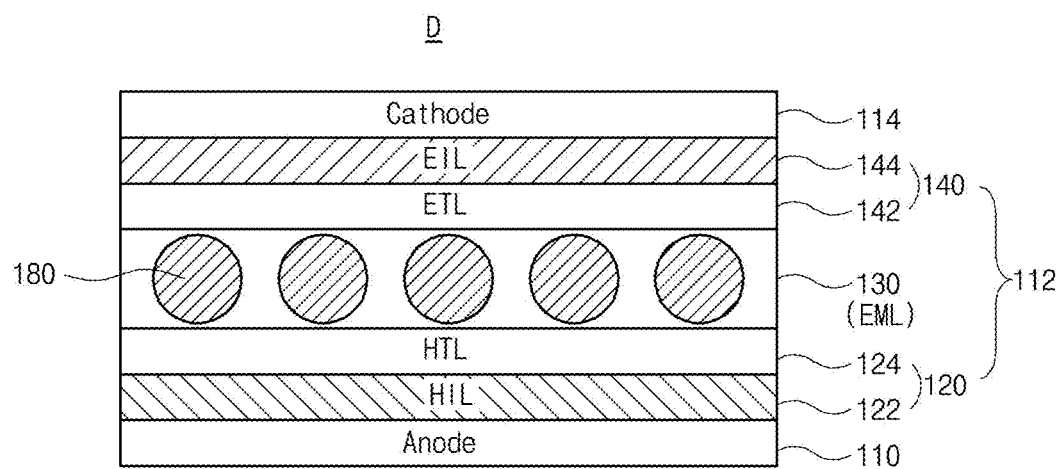
FIG. 3 is a schematic cross-sectional view of a QD light emitting diode according to a first embodiment of the present disclosure.

FIG. 3 is a schematic cross-sectional view of a QD light emitting diode according to a first embodiment of the present disclosure.

As shown in FIG. 3, the QD light emitting diode D of the present disclosure includes a first electrode 110, a second electrode 114 facing the first electrode 110 and an emitting layer 112 between the first and second electrodes 110 and 114. The emitting layer 112 includes a QD EML 130, a hole auxiliary layer 120 between the first electrode 110 and the QD EML 130 and an electron auxiliary layer 140 between the QD EML 130 and the second electrode 114.

The first electrode 110 may be an anode, and the second electrode 114 may be a cathode.

The hole auxiliary layer 120 may include a hole transporting layer (HTL) 124 between the first electrode 110 and the QD EML 130 and a hole injection layer (HIL) 122 between the first electrode 110 and the HTL 124. One of the HIL 122 and the HTL 124 may be omitted.

The electron auxiliary layer 140 may include an electron transporting layer (ETL) 142 between the QD EML 130 and the second electrode 114 and an electron injection layer (EIL) 144 between the ETL 142 and the second electrode 114. One of the ETL 142 and the EIL 144 may be omitted.

The QD EML 130 includes a plurality of QDs 180. Each QD 180 is formed of a semiconductor material.

The QD 180 includes a core, which is positioned in a center of the QD 180 and emits light, and a shell surrounding (or enclosing) the core.

The core and the shell have a difference in an energy bandgap. Each of the core and the shell may include a nono-size semiconductor material of II-VI group element or III-V group element. For example, the nano-size semiconductor material may be one of CdSe, CdS, CdTe, ZnSe, ZnTe, ZnS, InP and GaP.

For example, the QD 180 may have a structure of ZnSe/ZnS, CdSe/CdS, CdSe/ZnS, CdSe/ZnSe, CdTe/CdS, CdTe/ZnS, CdTe/ZnSe, CdS/ZnS, CdS, ZnSe, InP/CdS, InP/ZnS or InP/ZnSe.

The QD 180 may further include a ligand connected to (or combined with) a surface of the shell. The ligand may be C1 to C30 alkyl group, and the QD 180 may be dispersed in a solvent due to the ligand.

The hole auxiliary layer 120, e.g., the HTL 124, includes an organic material having a deep highest occupied molecular orbital (HOMO) level. For example, the organic material (a hole auxiliary material) may have a HOMO level of about −6.0 to −5.5 eV. The organic material may be poly-N-vinylcarbazole (PVK) or poly[(9,9-dioctylfluorenyl-2,7-diyl)-co-(4,4'-(N-(4-sec-butylphenyl)diphenylamine)] (TFB).

Since a difference between the HOMO level of the HTL 124 including the above organic material and a valence band level of the QD EML 130 including the QD 180 is small, the hole injection barrier is reduced (decreased).

In the related art QD light emitting diode, a charge balance between the hole from the anode and the electron from the cathode is degraded such that the emitting efficiency is decreased. In more detail, since the QD 180 has a deep valence band level, e.g., about −6.5 to −6.0 eV, there is a hole injection barrier between the HTL, which is formed of the related art material including a shallow HOMO level, and the QD EML 130.

In addition, since the QD 180 has high electron mobility, a charge balance between the hole and the electron in the QD EML 130 is degraded.

However, in the QD light emitting diode D according to the first embodiment of the present disclosure, since the HTL includes the organic material having a deep HOMO level, the hole injection property into the QD EML 130 is improved such that the charge balance in the QD EML 130 is improved.

Figure 4:
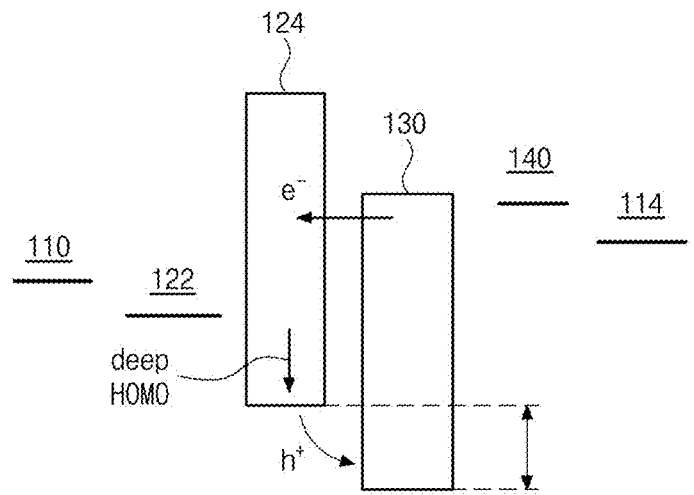
FIG. 4 is a schematic energy band diagram of the QD light emitting diode according to the first embodiment of the present disclosure.

Namely, referring to FIG. 4, which is a schematic energy band diagram of the QD light emitting diode according to the first embodiment of the present disclosure, the organic material in the HTL 124 has a deep HOMO level, a difference between the HOMO level of the HTL 124 and the valence band level of the QD EML 130 is decreased such that the hole injection property is improved.

Accordingly, the emitting efficiency decrease by the charge unbalance in the QD EML 130 is prevented or minimized.

On the other hand, there is a limitation in the HOMO level of the organic material, and an energy difference between the HOMO level, e.g., −6.0 eV, of the organic material in the HTL and the valence band level, e.g., −6.5 eV, of the QD is still relatively big. As a result, a desired charge balance between the hole and the electron is not provided. Particularly, when the ZnSe/ZnS QD, which has relatively deep valence band level, the charge unbalance is still generated even when the organic material having the deep HOMO level is included in the HTL 124.

In addition, the electron may be leak into the HTL 124 through the QD EML 124 such that the emitting efficiency of the QD light emitting diode D is still decreased.

Figure 5:
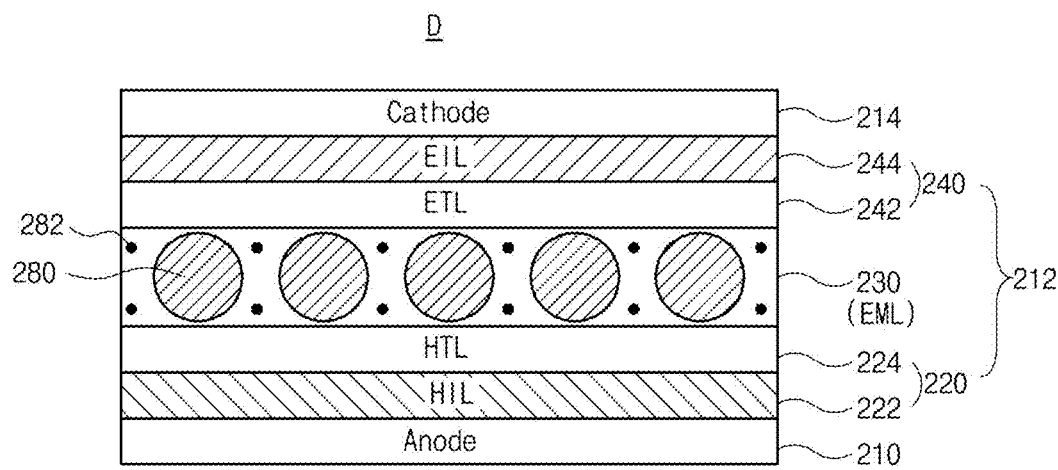
FIG. 5 is a schematic cross-sectional view of a QD light emitting diode according to a second embodiment of the present disclosure.

FIG. 5 is a schematic cross-sectional view of a QD light emitting diode according to a second embodiment of the present disclosure.

As shown in FIG. 5, the QD light emitting diode D of the present disclosure includes a first electrode 210, a second electrode 214 facing the first electrode 210 and an emitting layer 212 between the first and second electrodes 210 and 214. The emitting layer 212 includes a QD EML 230, a hole auxiliary layer 220 between the first electrode 210 and the QD EML 230 and an electron auxiliary layer 240 between the QD EML 230 and the second electrode 214. The QD EML 230 includes a QD 280 and an organic material 282.

The first electrode 210 may be an anode, and the second electrode 214 may be a cathode.

The hole auxiliary layer 220 may include a hole transporting layer (HTL) 224 between the first electrode 210 and the QD EML 230 and a hole injection layer (HIL) 222 between the first electrode 210 and the HTL 224. One of the HIL 222 and the HTL 224 may be omitted.

The hole auxiliary layer 220 includes a hole auxiliary material having a deep HOMO level. For example, the hole auxiliary material 120 may have a HOMO level of about −6.0 to −5.5 eV. The hole auxiliary material may be poly-N-vinylcarbazole (PVK) or poly[(9,9-dioctylfluorenyl-2,7-diyl)-co-(4,4'-(N-(4-sec-butylphenyl)diphenylamine)] (TFB).

For example, the HIL 222 may include a hole injection material such as PEDOT:PSS, and the HTL 224 may include the above hole auxiliary material.

The electron auxiliary layer 240 may include an electron transporting layer (ETL) 242 between the QD EML 230 and the second electrode 214 and an electron injection layer (EIL) 244 between the ETL 242 and the second electrode 214. One of the ETL 242 and the EIL 244 may be omitted.

The QD EML 230 includes the plurality of QDs 280, and the organic material 282. Each QD 280 is formed of a semiconductor material and includes a core, which is positioned in a center of the QD 180 and emits light, and a shell surrounding (or enclosing) the core.

The core and the shell have a difference in an energy bandgap. Each of the core and the shell may include a nano-size semiconductor material of II-VI group element or III-V group element. For example, the nano-size semiconductor material may be one of CdSe, CdS, CdTe, ZnSe, ZnTe, ZnS, InP and GaP.

For example, the QD 280 may have a structure of ZnSe/ZnS, CdSe/CdS, CdSe/ZnS, CdSe/ZnSe, CdTe/CdS, CdTe/ZnS, CdTe/ZnSe, CdS/ZnS, CdS, ZnSe, InP/CdS, InP/ZnS or InP/ZnSe.

The QD 280 may further include a ligand connected to (or combined with) a surface of the shell. The ligand may be C1 to C30 alkyl group, and the QD 180 may be dispersed in a solvent due to the ligand.

The organic material 282 has a HOMO level higher than the hole auxiliary material. For example, the organic material 282 in the QD EML 230 may have the HOMO level of about −5.5 to −5.0 eV. Namely, the HOMO level, e.g., −6.0 to −5.5 eV, of the hole auxiliary material in the HTL 224 is lower than the HOMO level, e.g., −5.5 to −5.0 eV, of the organic material 282 and higher than the valence band level, e.g., −6.0 to −6.5 eV, of the QD 280.

The organic material 282 may have a hole mobility of about $1*10^{-4}$ to $1*10^{-3}$ cm$^2$V$^{-1}$s$^{-1}$.

For example, the organic material 282 may be tris(4-carbazoyl-9-ylphenyl)amine (TCTA, $C_{54}H_{36}N_4$) or 4,4'-bis[N-(3-methylphenyl)-N-phenylamino]biphenyl (TPD, $C_{38}H_{32}N_2$).

The QD EML 230 includes the organic material 282, which has a HOMO level higher than the hole auxiliary material in the HTL 224 such that the valence band level (or the HOMO level) of the QD EML 230 is increased.

Figure 6:
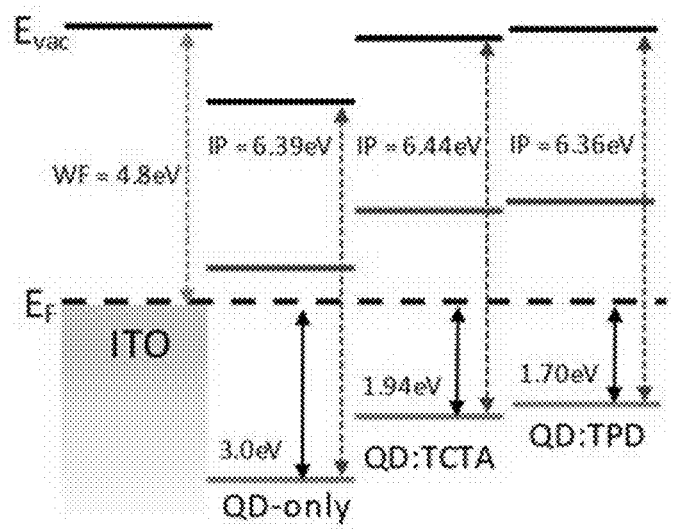
FIG. 6 is a graph illustrating an increase of a valence band level of a QD emitting material layer.

Referring to FIG. 6, which is a graph illustrating an increase of a valence band level of a QD emitting material layer, a difference between a Fermi level "$E_F$" of the QD EML and the valence band level "$E_{vac}$" of the QD EML is decreased. (3.0 eV→1.70~1.94 eV)

Figure 7:
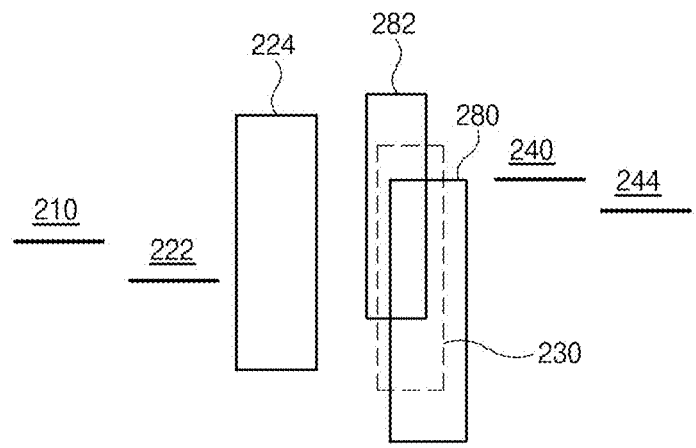
FIG. 7 is a schematic energy band diagram of the QD light emitting diode according to the second embodiment of the present disclosure.

Referring to FIG. 7, which is a schematic energy band diagram of the QD light emitting diode according to the second embodiment of the present disclosure, the QD EML 230 includes QD 282, since the valence band level of which is lower than the HOMO level of the hole auxiliary material in the HTL 224, and the organic material 284, the HOMO level of which is higher than the HMO level of the hole auxiliary material in the HTL 224, the valence band level (or the HOMO level) of the QD EML 230 is increased such that the difference between the HOMO level of the HTL 224 and the valence band level of the QD EML 230 is decreased.

Accordingly, the hole injection property into the QD EML 230 is increased or improved, and the charge balance between the hole and the electron in the QD EML 230 is improved.

In addition, since the lowest unoccupied molecular orbital (LUMO) level of the organic material 282 is higher than the conduction band level of the QD 280, there is an electron injection barrier to the QD EML 230. As a result, the charge balance between the hole and the electron in the QD EML 230 is further improved.

[Electron Only Device]

A cathode (Al, 100 nm), an ETL (ZnO, 20 nm), a QD EML (15 nm), an ETL (ZnO, 20 nm), a cathode (Al, 100 nm) are sequentially stacked to form a device. A current density according to a voltage is measured and shown in FIG. 8. In this instance, the organic material of TCTA or TPD in the QD EML 230 has 5 wt % with respect to the QD (ZnSe/ZnS).

Figure 8:
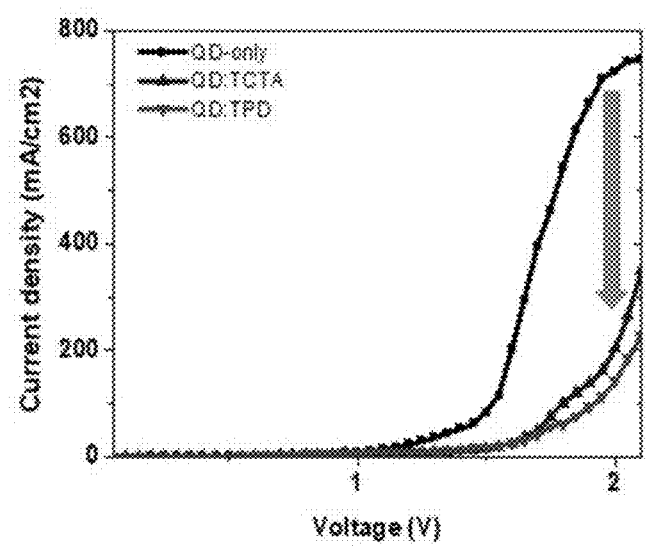
FIG. 8 is a graph illustrating an electron injection barrier function of an organic material.

As shown in FIG. 8, the organic material is included in the QD EML, and the electron current density is decreased. Namely, the organic material in the QD EML acts as a barrier to electron injection such that the electron injection rate into the QD EML is lowered.

In addition, since the organic material 282 having a high LUMO level forms the QD EML 230 with the quantum dot 280, the electrons are confined in the QD EML 230. Namely, the electron leakage to the hole auxiliary layer 220 is prevented such that the emitting efficiency of the QD light emitting diode D is improved.

In the QD EML 230, the organic material 282 has a smaller weight ratio (wt %) than the QD 280. For example, the organic material 282 may have a wt % of about 3 to 6 with respect to the QD 280, and preferably a wt % of about 5.

As described above, the valence band level (or the HOMO level) of the QD EML 230 is increased by the organic material having a higher HOMO level than the hole auxiliary material in the hole auxiliary layer 220. However, when the amount of the organic material in the QD EML 230 is increased, a portion including only the organic material without the QD may be present in the QD EML 230. In this case, the current leakage occurs such that the emitting efficiency of the QD light emitting diode D is decreased.

In addition, as described below, when the QD EML 230 is formed by coating an emitting material in a solution state, the amount of the polar solvent should be increased when the amount of the organic material is increased. In this case, the hole auxiliary layer 220 may be damaged by the polar solvent.

In the QD light emitting diode (D) according to the second embodiment of the present disclosure, the QD EML 230 includes the quantum dot 280 and the organic material 282 having the HOMO level higher than the valence band level of the QD 280, and the weight ratio of the organic material 282 is smaller than that of the QD 280. Accordingly, the valence band level of the QD EML 230 is increased without damage on the hole auxiliary layer 220.

In addition, since the organic material has the HMO level higher than the hole auxiliary material in the HTL 224, the difference between the valence band level of the QD EML 230 and the HOMO level of the HTL 224 is sufficiently decreased even when the organic material 282 has a weight ratio smaller than the QD 280.

Accordingly, in the QD light emitting diode D according to the second embodiment of the present disclosure, the charge balance between the hole and the electron is improved, and the emitting efficiency is increased.

In the QD light emitting diode D according to the second embodiment of the present disclosure, the QD EML 230 is formed by a solution process. A fabrication method of the QD light emitting diode D is briefly explained with FIG. 5.

A transparent conductive material, e.g., ITO or IZO, is deposited and patterned by a mask process to form the first electrode 110 as an anode.

Next, a hole injection material, e.g., PEDOT:PSS, is coated on the first electrode 110 to form the HIL 222, and a hole auxiliary material, e.g., PVK or TFB, is coated to form the HTL 224.

Next, an emitting material solution, which includes a QD (ZnSe/ZnS), an organic material (TCTA or TPD), a non-polar solvent and a polar solvent, is coated and dried to form the QD EML 230 on the HTL 224. In this instance, the organic material has a weight ratio smaller than the QD, and the polar solvent has a weight ratio smaller than the non-polar solvent. For example, the wt % of the organic material with respect to the QD and the wt % of the polar solvent with respect to the non-polar solvent may be about 3 to 6. The weight ratio of the organic material with respect to the QD and the weight ratio of the polar solvent with respect to the non-polar solvent may be same or different.

For example, the non-polar solvent may be octane or hexane, and the polar solvent may be toluene, chlorobenzene or chloroform. However, it is not limited thereto.

Since the organic material is not dissolved in the non-polar solvent, the QD EML can not be formed by the solution process when the emitting material solution includes the non-polar solvent without the polar solvent. On the other hand, since the QD can be dissolved in the polar solvent as well as the non-polar solvent, the QD EML 230 including the QD and the organic material may be formed by using an emitting material solution with the polar solvent and without the non-polar solvent.

However, when the emitting material solution with the polar solvent is coated, a problem of damages on the HTL 224 may be generated.

Accordingly, in the present disclosure, the emitting material solution, in which the polar solvent has a weight ratio smaller than the non-polar solvent, is coated to form the QD EML 230 including the QD and the organic material without the damage on the HTL 224.

On the other hand, when the weight ratio (amount) of the organic material in the emitting material solution is increased, the organic material may be precipitated on a surface of the QD EML 230 such that the surface of the QD EML 230 may be roughened. As a result, the emitting property of the QD light emitting diode D may be decreased.

Next, the ETL (ZnO) 240 and the second electrode (Al) 214 are sequentially formed to form the QD light emitting diode D.

[QD Light Emitting Diode 1]

Following layers are sequentially formed on an anode (ITO, 150 nm).

(1) an HIL (PEDOT:PSS, 30 nm); (2) an HTL (PVK, 50 nm); an QD EML (15 nm); an ETL (ZnO, 20 nm); and a cathode (Al, 100 nm).

(1) Comparative Example (Ref)

The QD EML is formed of the QD (ZnSe/ZnS) without an organic material.

(2) Example 1 (Ex1)

The QD EML is formed of the QD (ZnSe/ZnS) and TAPC (5 wt %).

(3) Example 2 (Ex2)

The QD EML is formed of the QD (ZnSe/ZnS) and TPD (5 wt %).

The properties of the QD light emitting diodes in Comparative Example and Examples 1 and 2 are measured and listed in Table 1. In addition, the properties are shown in FIGS. 9 to 11.

TABLE 1

|  | Turn-on voltage [V @ 1 cd/m$^2$] | Luminance [cd/m$^2$] | Peak EQE [%] | ΔEQE [%] |
| --- | --- | --- | --- | --- |
| Ref | 7 | 265 ± 35 | 2.0 ± 0.3 | — |
| Ex1 | 6.5~7 | 354 ± 16 | 2.4 ± 0.1 | 121 |
| Ex2 | 6.5 | 433 ± 17 | 3.8 ± 0.6 | 190 |

Figure 9:
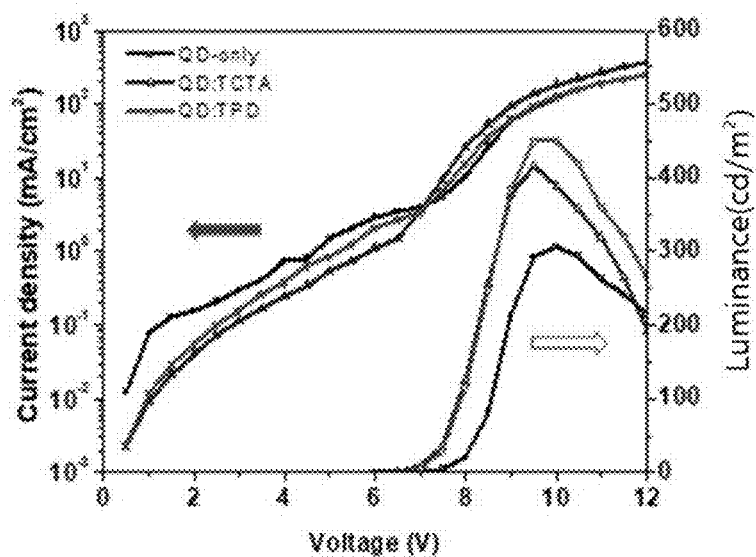
FIG. 9 is a graph s illustrating a current density and luminance of a QD light emitting diode.
Figure 10:
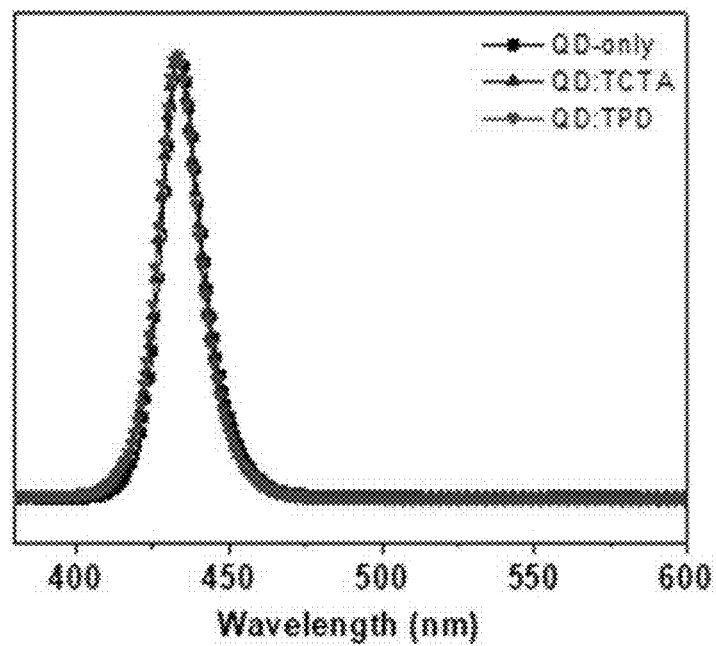
FIG. 10 is a graph illustrating a normalized light emission intensity of a QD light emitting diode.
Figure 11:
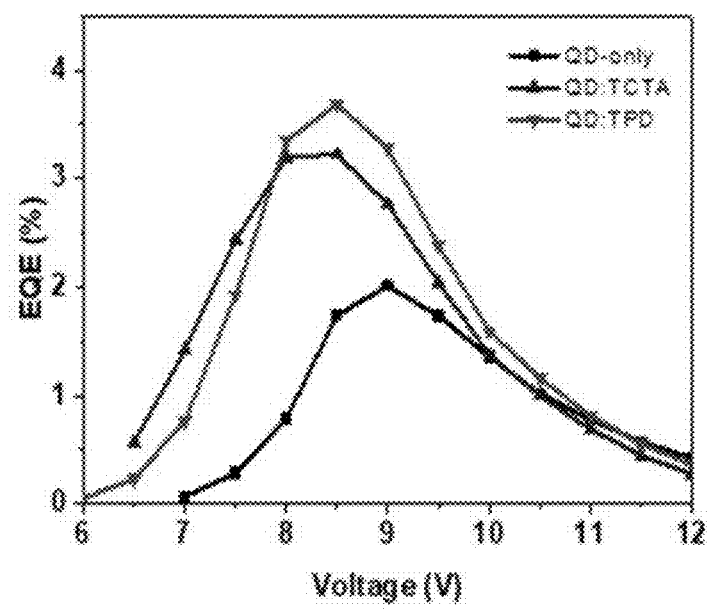
FIG. 11 is a graph illustrating a quantum efficiency of a QD light emitting diode.

As shown in Table 1 and FIGS. 9 to 11, in comparison to the QD light emitting diode in Comparative Example, in which the QD EML includes the QD without the organic material, the QD light emitting diode in Examples 1 and 2, in which the QD EML includes the QD and the organic material, has advantages in the driving voltage, the luminance and the quantum efficiency (EQE).

[QD Light Emitting Diode 2]

Following layers are sequentially formed on an anode (ITO, 150 nm).

(1) an HIL (PEDOT:PSS, 30 nm); (2) an HTL (PVK, 50 nm); an QD EML (QD(ZnSe/ZnS)+TCTA, 15 nm); an ETL (ZnO, 20 nm); and a cathode (Al, 100 nm).

Figure 12:
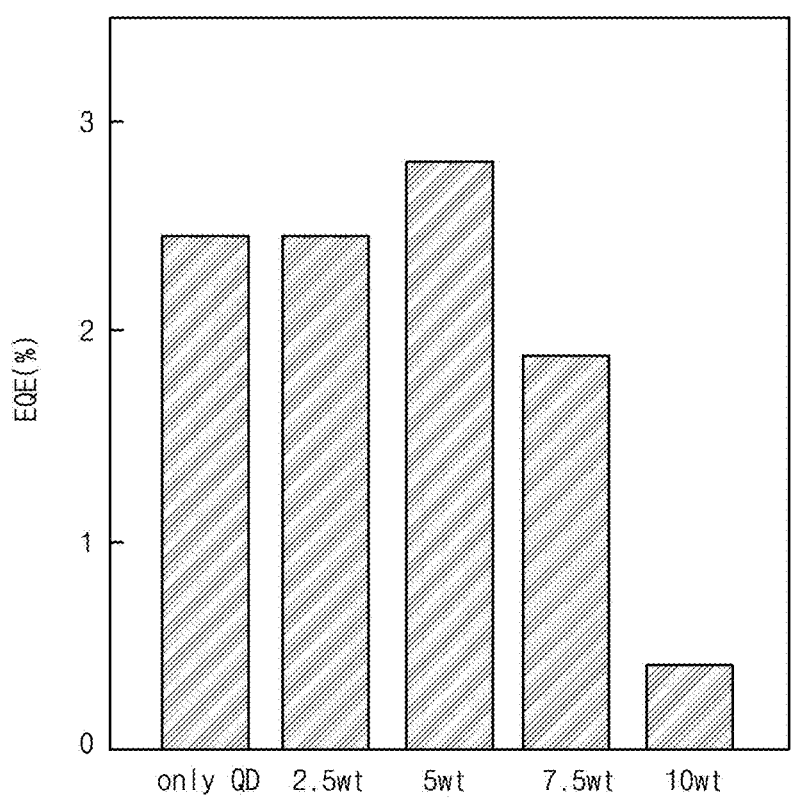
FIG. 12 is a graph illustrating a quantum efficiency according to a ratio of a QD and an organic material in a QD emitting layer.

In the QD light emitting diode, the EQE of the QD light emitting diode is measured with changing a ratio (weight %) of the organic material (TCTA) with respect to the QD and listed in FIG. 12.

As shown in FIG. 12, when the weight ratio of the organic material is 2.5% or less, almost the same quantum efficiency as in the case of no organic material was measured. Namely, when the weight ratio of the organic material is 2.5% or less, the effect of increase the valence band level of the QD EML by the organic material is hardly realized.

On the other hand, if the weight ratio of the organic material is too large (for example, 7.5% or more), the quantum efficiency is decreased. When the amount of the organic material in the QD EML, which is formed by a solution process, is increased, the organic material does not dissolve in the non-polar solvent, which is the majority of the solvent, and precipitates on the surface of the quantum dot luminescent material layer such that the quantum efficiency may be decreased.

Therefore, the weight ratio of the organic material to the quantum dot in the QD EML may be about 3 to 6%, preferably 4 to 6%, more preferably 5%.

As described above, in the QD light emitting diode and the QD light emitting display device of the present disclosure, the QD EML includes the organic material having a higher HOMO level than the hole auxiliary layer material together with the quantum such that the charge balance in the QD EML is improved.

Accordingly, the luminance and the quantum efficiency of the QD light emitting diode and the QD light emitting display device are improved.

It will be apparent to those skilled in the art that various modifications and variations can be made in the aspects of the disclosure without departing from the spirit or scope of the disclosure. Thus, it is intended that the present disclosure covers the modifications and variations of this disclosure provided they come within the scope of the appended claims and their equivalents.

What is claimed is:

1. A quantum dot (QD) light emitting diode, comprising:
a first electrode;
a second electrode facing the first electrode;
a QD emitting material layer positioned between the first electrode and the second electrode and including a QD and an organic material;
a hole auxiliary layer positioned between the first electrode and the QD emitting material layer; and
an electron auxiliary layer positioned between the QD emitting material layer and the second electrode,
wherein the organic material has a highest occupied molecular orbital (HOMO) level higher than a material of the hole auxiliary layer.

2. The QD light emitting diode according to claim 1, wherein in the QD emitting material layer, an amount of the organic material is smaller than that of the QD.

3. The QD light emitting diode according to claim 2, wherein the organic material has a weight % of 3 to 6 with respect to the QD.

4. The QD light emitting diode according to claim 1, wherein a HOMO level of the organic material has a range of −5.5 to −5.0 eV, and a HOMO level of the material of the hole auxiliary layer has a range of −6.0 to −5.5 eV, and
wherein a valence band level of the QD has a range of −6.5 to −6.0 eV.

5. The QD light emitting diode according to claim 1, wherein the organic material is tris(4-carbazoyl-9-ylphenyl)amine (TCTA) or 4,4'-bis[N-(3-methylphenyl)-N-phenylamino]biphenyl (TPD), and the material of the hole auxiliary layer is poly-N-vinylcarbazole (PVK) or poly[(9,9-dioctylfluorenyl-2,7-diyl)-co-(4,4'-(N-(4-sec-butylphenyl)diphenylamine)] (TFB).

6. The QD light emitting diode according to claim 1, wherein a lowest unoccupied molecular orbital (LUMO) level of the organic material is higher than a conduction band level of the QD.

7. The QD light emitting diode according to claim 1, wherein a valence band level of the QD emitting material layer is higher than that of the QD, and a conduction band level of the QD emitting material layer is higher than that of the QD.

8. The QD light emitting display device according to claim 1, wherein a valence band level of the QD emitting material layer is higher than that of the QD, and a conduction band level of the QD emitting material layer is higher than that of the QD.

9. A QD light emitting display device, comprising:
a substrate;
a QD light emitting diode positioned on or over the substrate, the QD light emitting diode including:
a first electrode;
a second electrode facing the first electrode;
a QD emitting material layer positioned between the first electrode and the second electrode and including a QD and an organic material;
a hole auxiliary layer positioned between the first electrode and the QD emitting material layer; and
an electron auxiliary layer positioned between the QD emitting material layer and the second electrode; and
a thin film transistor positioned between the substrate and the QD light emitting diode and connected to the QD light emitting diode,
wherein the organic material has a HOMO level higher than a material of the hole auxiliary layer.

10. The QD light emitting display device according to claim 9, wherein in the QD emitting material layer, an amount of the organic material is smaller than that of the QD.

11. The QD light emitting display device according to claim 10, wherein the organic material has a weight % of 3 to 6 with respect to the QD.

12. The QD light emitting display device according to claim 9, wherein a HOMO level of the organic material has a range of −5.5 to −5.0 eV, and a HOMO level of the material of the hole auxiliary layer has a range of −6.0 to −5.5 eV, and
wherein a valence band level of the QD has a range of −6.5 to −6.0 eV.

13. The QD light emitting display device according to claim 9, wherein the organic material is tris(4-carbazoyl-9-ylphenyl)amine (TCTA) or 4,4'-bis[N-(3-methylphenyl)-N-phenylamino]biphenyl (TPD), and the material of the hole auxiliary layer is poly-N-vinylcarbazole (PVK) or poly[(9,9-dioctylfluorenyl-2,7-diyl)-co-(4,4'-(N-(4-sec-butylphenyl)diphenylamine)] (TFB).

14. The QD light emitting display device according to claim 9, wherein a LUMO level of the organic material is higher than a conduction band level of the QD.

* * * * *